（12） United States Patent
Kim

(10) Patent No.: US 8,013,769 B2
(45) Date of Patent: Sep. 6, 2011

(54) DIGITAL-TO-ANALOG CONVERTER AND METHOD OF DIGITAL-TO-ANALOG CONVERSION

(75) Inventor: Hyung-Tae Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1217 days.

(21) Appl. No.: 11/714,896

(22) Filed: Mar. 7, 2007

(65) Prior Publication Data

US 2007/0216633 A1 Sep. 20, 2007

(30) Foreign Application Priority Data

Mar. 16, 2006 (KR) .......................... 10-2006-0024316

(51) Int. Cl.
*H03M 1/66* (2006.01)
(52) U.S. Cl. .......... 341/144; 341/145; 341/150; 345/87; 345/98; 345/99; 345/100
(58) Field of Classification Search .................. 345/100; 341/144, 145, 150
See application file for complete search history.

(56) References Cited

U.S. PATENT DOCUMENTS

| 4,587,443 | A | * | 5/1986 | van de Plassche | 327/95 |
| 5,453,757 | A | * | 9/1995 | Date et al. | 345/89 |
| 5,923,312 | A | * | 7/1999 | Okada et al. | 345/95 |
| 6,081,218 | A | * | 6/2000 | Ju et al. | 341/150 |
| 6,473,020 | B2 | * | 10/2002 | Tsukamoto | 341/154 |
| 6,831,585 | B2 | * | 12/2004 | Mulder et al. | 341/156 |
| 6,937,178 | B1 | * | 8/2005 | Rempfer et al. | 341/154 |
| 7,126,518 | B2 | * | 10/2006 | Tsuchi | 341/144 |
| 7,236,114 | B2 | * | 6/2007 | Ahn | 341/144 |
| 7,283,082 | B1 | * | 10/2007 | Kuyel et al. | 341/155 |
| 2002/0030620 | A1 | * | 3/2002 | Cairns et al. | 341/145 |
| 2003/0132907 | A1 | | 7/2003 | Lee et al. | |
| 2004/0125067 | A1 | | 7/2004 | Kim et al. | |
| 2005/0068216 | A1 | * | 3/2005 | Mulder et al. | 341/154 |
| 2006/0092119 | A1 | * | 5/2006 | Kim et al. | 345/98 |
| 2006/0125676 | A1 | * | 6/2006 | Kobayashi | 341/155 |
| 2006/0132344 | A1 | * | 6/2006 | Ishii et al. | 341/144 |
| 2006/0214900 | A1 | * | 9/2006 | Tsuchi et al. | 345/98 |
| 2009/0096817 | A1 | * | 4/2009 | Nishimura et al. | 345/690 |

FOREIGN PATENT DOCUMENTS

KR    10-2005-0070552    7/2005

* cited by examiner

*Primary Examiner* — Richard Hjerpe
*Assistant Examiner* — Dorothy Harris
(74) *Attorney, Agent, or Firm* — Harness, Dickey & Pierce, PLC

(57) ABSTRACT

In one embodiment, the DAC includes an analog gray voltage generation unit configured to generate a plurality of analog gray voltages, and a first decoder configured to select two different voltages of the plurality of the gray voltages as a first level voltage and a second level voltage, respectively, in response to an upper K-bits of N-bit input image data. Here, N may be an integer not less than two, and K may be an integer less than N. A second decoder may be configured to repeatedly distribute the first level voltage and the second level voltage to output a plurality of distributed voltages in response to a lower L-bits of the N-bit input image data. Here, L may be equal to N subtracted by K, and L may be less than K. An interpolated voltage generation unit may be configured to generate an interpolated voltage based on the plurality of distributed voltages.

18 Claims, 8 Drawing Sheets

FIG. 6

| D[9]-D[2] | D[1] | D[0] | OUTPUT OF DECODER1 | V1,V2,V3,V4 | OUT |
|---|---|---|---|---|---|
| xxxxxxxx | 0 | 0 | Vh, Vl | Vh,Vh,Vh,Vh | Vh |
| xxxxxxxx | 0 | 1 | | Vh,Vh,Vh,Vl | (3Vh+Vl)/4 |
| xxxxxxxx | 1 | 0 | | Vh,Vh,Vl,Vl | (Vh+Vl)/2 |
| xxxxxxxx | 1 | 1 | | Vh,Vl,Vl,Vl | (Vh+3Vl)/4 |

| D[9]~D[2] | D[1] | OUTPUT OF DECODER1 | V1,V2 | OUT |
|---|---|---|---|---|
| xxxxxxxx | 0 | Vh, Vl | Vh,Vh | Vh |
| xxxxxxxx | 1 | | Vh,Vl | (Vh+Vl)/2 |

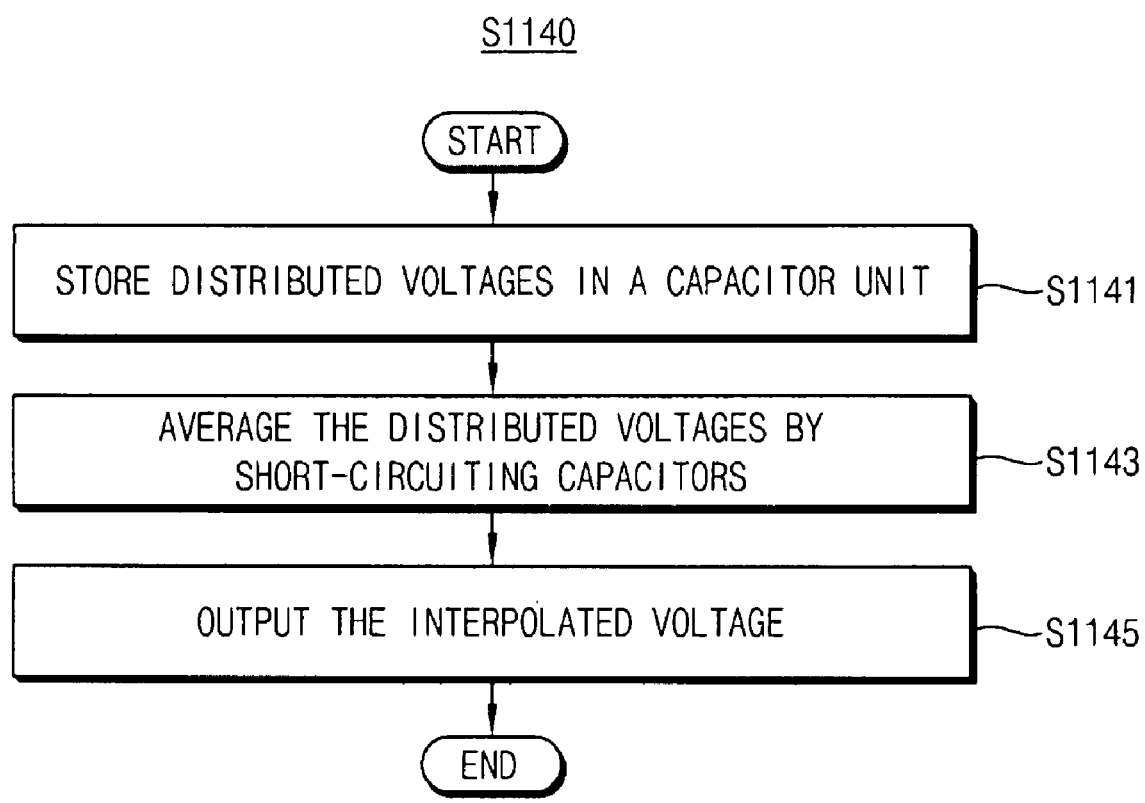

DIGITAL-TO-ANALOG CONVERTER AND METHOD OF DIGITAL-TO-ANALOG CONVERSION

FOREIGN PRIORITY INFORMATION

This application claims priority under 35 USC §119 to Korean Patent Application No. 2006-24316, filed on Mar. 16, 2006 in the Korean Intellectual Property Office (KIPO), the disclosure of which is incorporated herein in its entirety by reference.

BACKGROUND OF THE INVENTION

1. Field of the Invention

The present invention relates to digital-to-analog conversion, and a method of digital-to-analog conversion.

2. Description of the Related Art

Nowadays, thin-film transistor-liquid crystal displays (TFT-LCDs) are the widely used among various flat panel displays.

FIG. 1 is a block diagram illustrating a conventional TFT-LCD panel and peripheral circuits.

An LCD panel 110 may include an upper plate and a lower plate, each including a plurality of electrodes for forming electric fields, a liquid crystal layer between the upper and lower plates, and polarization plates, which are respectively attached to the upper and lower plates, for polarizing light. The brightness of light that is transmitted through a TFT-LCD 100 is controlled by applying corresponding voltages (gray voltages) to pixel electrodes to re-arrange liquid crystal molecules in the liquid crystal layer and provide various gray levels. For applying the gray voltages to the pixel electrodes, a plurality of switching devices, such as TFTs, connected to the pixel electrodes are located on the lower plate of the TFT-LCD panel 110. The switching devices (e.g., TFTs) control the brightness of light through a pixel area and, for color displays, three colors (e.g., R (Red), G (Green), and B (Blue)) can be formed through a pixel array with a color filter arrangement as shown in FIG. 2.

The TFT-LCD 100 includes gate drivers 120 for driving a plurality of gate lines arranged horizontally and source drivers 130 for driving a plurality of source lines arranged vertically. The source and gate lines are arranged on the LCD panel 110 in a matrix configuration. The gate and source drivers 120 and 130 are controlled by a controller (not shown). Generally, the controller is disposed outside the LCD panel 110. The gate and source drivers 120 and 130 are generally disposed outside the LCD panel 110; however, the gate and source drivers 120 and 130 may be disposed on the LCD panel 110 in a chip-on-glass (COG) display.

FIG. 3 is a block diagram illustrating a conventional source driver.

Referring to FIG. 3, the conventional source driver 130 includes a plurality of gamma decoders 131 and buffers 132. Each gamma decoder 131 receives n-bit image data (n=6, 8, 10, . . . ), and selectively outputs an analog voltage corresponding to a digital value of the image data from among 2n analog gray voltages. A graphics card, for example, in the controller processes a three color signal (e.g., red-green-blue (RGB) digital data) to obtain the image data according to the resolution of the LCD panel 110. Analog image signals output from the gamma decoder 131 are buffered by the corresponding buffers 132 and respectively output to source lines S1, S2, S3, etc. The analog image signals output from the buffers 132 quickly charge the source lines S1, S2, S3, etc. and corresponding pixels on the LCD panel 110. Liquid crystal molecules of the pixels receiving the image signals are re-arranged in proportion to applied gray voltages, and thereby control the brightness of light transmitted therethrough.

For enhancing color reproducibility by increasing the number of bits of R, G, and B image data, the area of a gamma decoder circuit used to decode the bits may increase in proportion to the increased number of bits. To avoid such an increase in circuit complexity, an amplifier interpolation scheme has been developed. According to one such amplifier interpolation scheme, representative gray voltages are selected based on upper bits of digital image data and intermediate values are created from the selected representative gray voltages based on the remaining lower bits. The amplifier interpolation scheme may use a half method capable of reducing the gamma decoder circuit area by ½, or a quarter method capable of reducing the area by ¼. In the half method, intermediate interpolated voltages are created from representative gray voltages selected based on the upper bits of input image data. In the quarter method, interpolated voltages with ¼ the interval of representative gray voltages selected based on the upper bits of input image data are created.

This conventional amplifier interpolation scheme depends on input voltages of an amplifier used for interpolation. Interpolation of the voltages may become skewed when differences between input voltages of the amplifier are not small or when the differences are not equal for all gray levels. Accordingly, a source driver that uses the conventional interpolation scheme may not create interpolated voltages that enable generation of stable and uniformly distributed gray level differences. In addition, the source driver requires an offset control device for controlling output differences owing to the self-offset of the amplifier.

SUMMARY OF THE INVENTION

The present invention relates to a digital-to-analog converter (DAC).

In one embodiment, the DAC includes an analog gray voltage generation unit configured to generate a plurality of analog gray voltages, and a first decoder configured to select two different voltages of the plurality of the gray voltages as a first level voltage and a second level voltage, respectively, in response to an upper K-bits of N-bit input image data. Here, N may be an integer not less than two, and K may be an integer less than N. A second decoder may be configured to repeatedly distribute the first level voltage and the second level voltage to output a plurality of distributed voltages in response to a lower L-bits of the N-bit input image data. Here, L may be equal to N subtracted by K, and L may be less than K. An interpolated voltage generation unit may be configured to generate an interpolated voltage based on the plurality of distributed voltages.

The present invention also relates to a method of digital-to-analog (DA) conversion.

In one embodiment, the method includes generating a plurality of analog gray voltages, and selecting two different voltages of the plurality of the gray voltages as a first level voltage and a second level voltage in response to an upper K-bits of N-bit input image data. Here, N may be an integer not less than two, and K may be an integer less than N. The first level voltage and the second level voltage may be distributed repeatedly to generate a plurality of distributed voltages in response to a lower L-bits of the N-bit input image data. Here, L may be equal to N subtracted by K, and L may be less than K. The plurality of distributed voltages may be averaged to output an interpolated voltage.

BRIEF DESCRIPTION OF THE DRAWINGS

FIG. 6 is a table illustrating interpolated voltages in FIG. 5.

FIG. 12 is a flow chart illustrating the step of averaging the distributed voltages in FIG. 11.

DESCRIPTION OF EXAMPLE EMBODIMENTS

Figure 1:
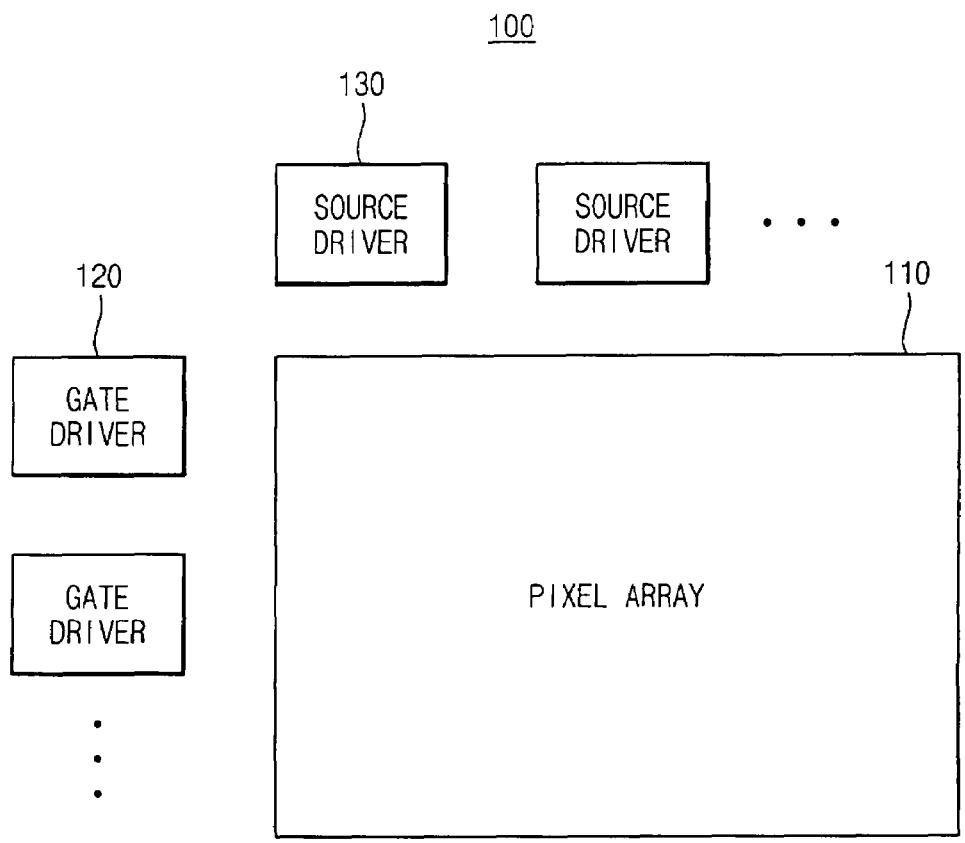
FIG. 1 is a block diagram illustrating a prior art thin-film transistor-liquid crystal display (TFT-LCD) panel and peripheral circuits.
Figure 2:
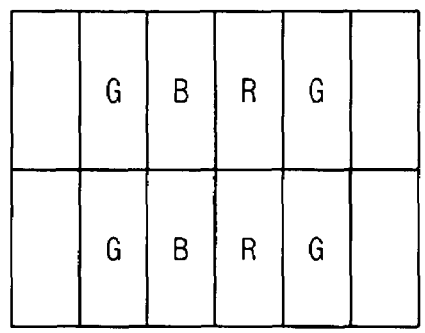
FIG. 2 illustrates a prior art pixel structure.
Figure 3:
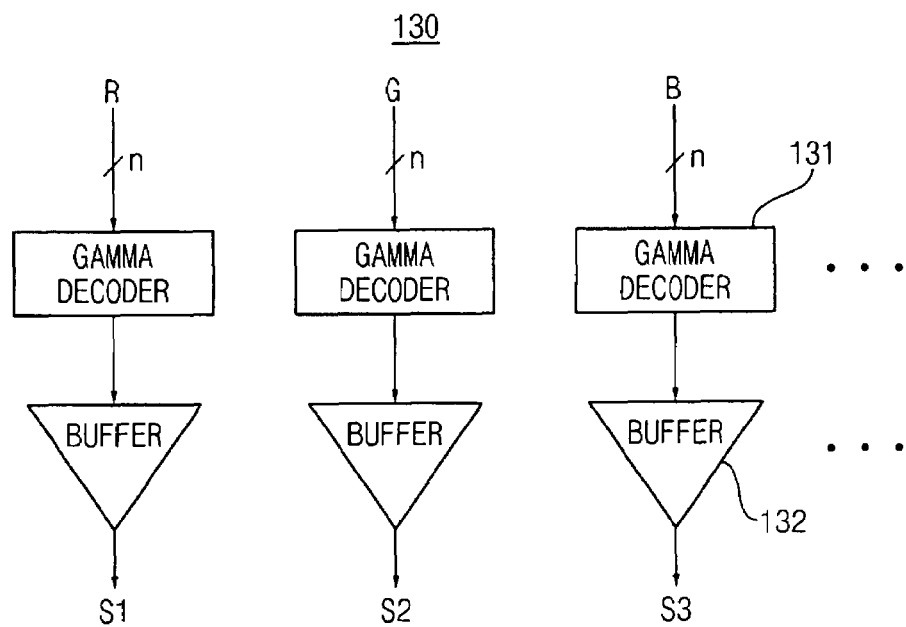
FIG. 3 is a block diagram illustrating a prior art source driver.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
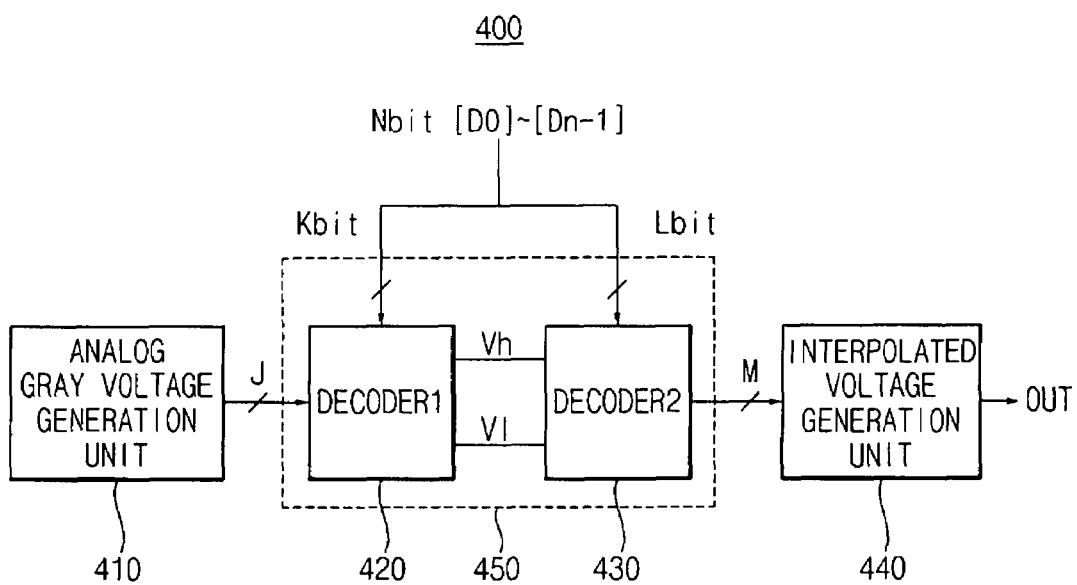
FIG. 4 is a block diagram illustrating a digital-to-analog converter (DAC) according to an example embodiment of the present invention.

FIG. 4 is a block diagram illustrating a digital-to-analog converter (DAC) according to an example embodiment of the present invention.

Referring to FIG. 4, a DAC according to an example embodiment of the present invention may include an analog gray voltage generation unit 410 that generates a plurality of gray analog voltages, a first decoder 420, a second decoder 430, and/or an interpolated voltage generation unit 440. The first decoder 420 and the second decoder 430 may form a decoder unit 450.

Figure 5:
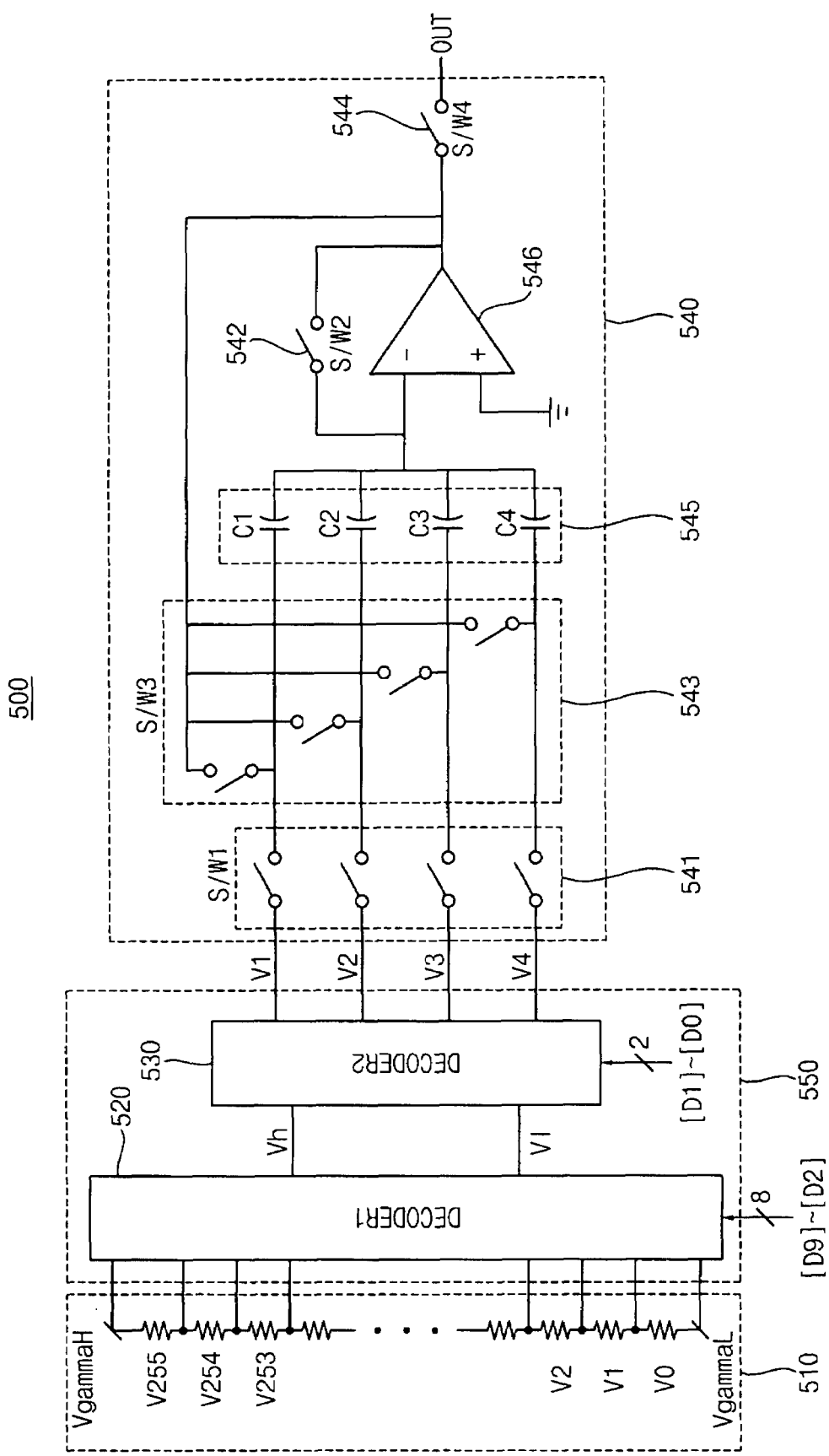
FIG. 5 is a circuit diagram illustrating a configuration of the DAC in FIG. 4 that processes 10-bit input image data by using an 8-bit standard circuit.
Figure 9:
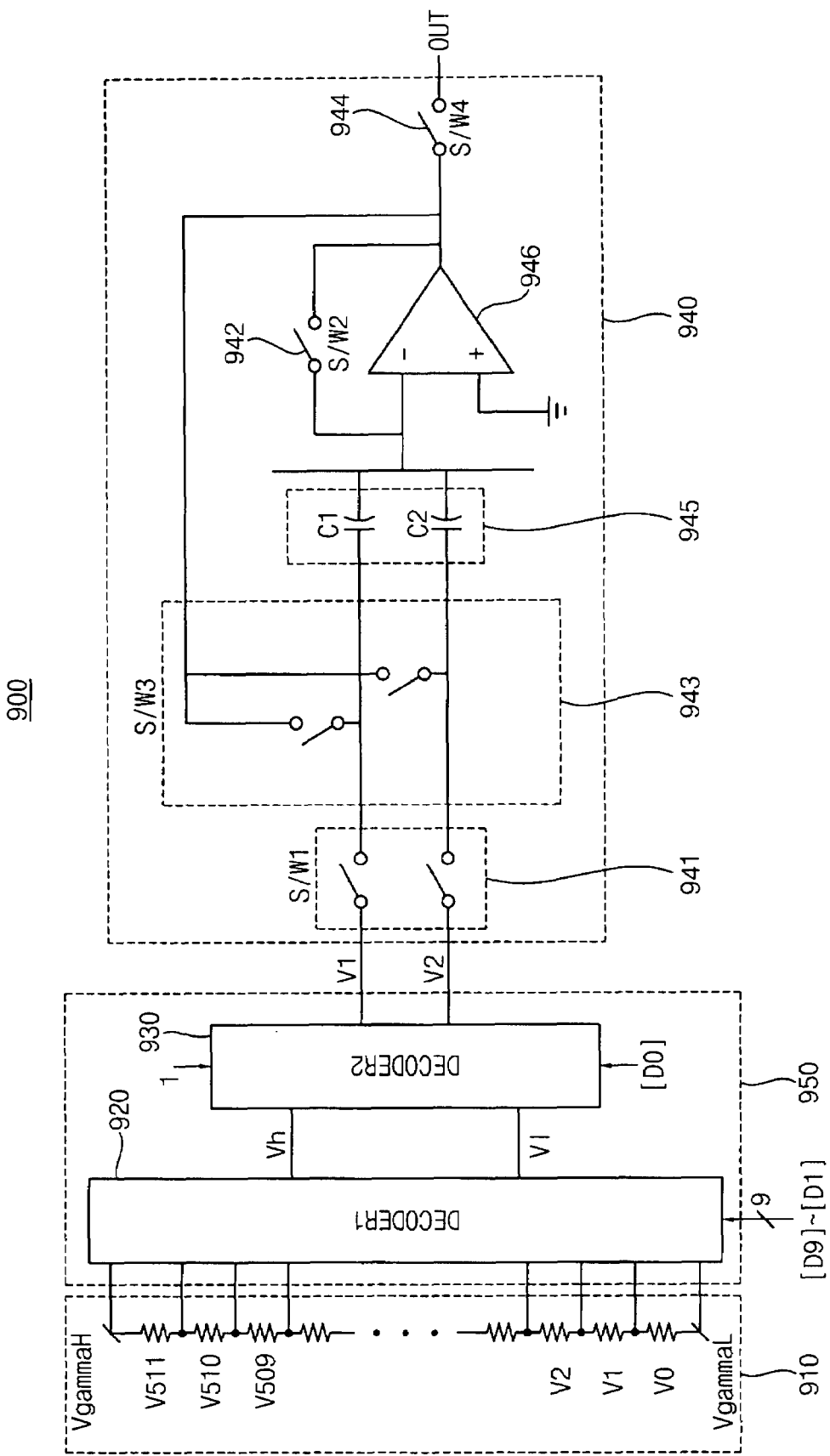
FIG. 9 is a circuit diagram illustrating another configuration of the DAC in FIG. 4 that processes 10-bit input image data by using a 9-bit standard circuit.

As will be shown in FIGS. 5 and 9, the analog gray voltage generation unit 410 may be implemented with a plurality of resistor arrays connected in series between a high reference voltage VgammaH and a low reference voltage VgammaL. The analog gray voltage generation unity may generate $2^K$ (=J) levels of analog gray voltages ranging from a 0 gray level to a $2^K-1$ gray level.

The decoder unit 450 may receive the analog gray voltages and N-bit (N=8, 10, . . . ) input image data [D0] to [Dn-1], and may output 2L (=M) distributed voltages. The input image data [D0] to [Dn-1] is digital data obtained by processing a three-color signal (e.g., red-green-blue (RGB) digital data) transmitted from a controller (not shown) according to a resolution of the liquid crystal display (LCD) panel (not shown) as is well known.

The interpolated voltage generation unit 440 generates various analog interpolated voltages corresponding to the distributed voltages. The decoder unit 450 may generate M distributed voltages in various configurations, and the interpolated voltage generation unit 440 may generate corresponding interpolated voltages in response to the distributed voltages in various configurations. The interpolated voltages from the interpolated voltage generation unit 440 may drive a plurality of source lines on the LCD panel.

In FIG. 4, the decoder unit 450 may include a first decoder 420 and a second decoder 430. The first decoder 420 may receive upper K-bit image data of N-bit input image data. As will be recalled, the analog gray voltage generation unit 410 generates, for example, $2^K$ levels of analog gray voltages. The first decoder 420 may select two different voltages of the $2^K$ levels of the analog gray voltages as a first level voltage and a second level voltage, respectively. The second decoder 430 may receive the remaining lower L-bit image data of the input image data. The second decoder 430 may distribute the first level voltage and the second level voltage repeatedly and output M distributed voltages according to a logic combination of the lower L-bit image data.

The interpolated voltage generation unit 440 may average the M distributed voltages and output the interpolated voltages by using a sample-and-hold scheme.

In the DAC for processing the N-bit image data, the analog gray voltage generation unit 410 may generate $2^K$ levels of analog gray voltages instead of generating $2^N$ levels of analog gray voltages. The $2^K$ levels of analog gray voltages are smaller than the $2^N$ levels of analog gray voltages. Here, K is the number of the upper bits of the N-bit input image data [D0] to [Dn-1]. When the decoder unit 450 generates M distributed voltages, the number of $2^K$ levels of analog gray voltages is the same as $2^N/M$. For example, the input image data may correspond to 10-bit input image data, and the upper bits may correspond to 8-bit input image data. In this case, the analog gray voltage generation unit 410 generates $2^8$ (=256) levels of analog gray voltages, and the decoder unit 450 may generate four distributed voltages by a logic combination of the remaining lower 2 bits. That is, 2 levels of analog gray voltages among 256 levels of the analog gray voltages are selected as representative gray voltages. The four distributed voltages from the second decoder 430 may be interpolated by the interpolated voltage generation unit 440, and voltages having levels between the representative gray voltages may be generated. The interpolated voltage generation unit 440 may generate four types of interpolated voltages. Therefore, the total number of the interpolated voltages that may be generated by the interpolated voltage generation unit 440 corresponds to 1,024 obtained by 256 multiplied by 4. Thus, 1,024 gray levels may be displayed in each pixel of the LCD panel.

Accordingly, a circuit area may be reduced because the size of the decoder of the DAC may be reduced, and the number of analog gray voltages may be reduced.

FIG. 5 is a circuit diagram illustrating a configuration of the DAC of FIG. 4 that processes 10-bit input image data by using an 8-bit standard circuit.

Referring to FIG. 5, a DAC 500 includes an analog gray voltage generation unit 510, a decoder unit 550 including a first decoder 520 and a second decoder 530, and/or an interpolated voltage generation unit 540.

The gray voltage generation unit 510 may generate $2^8$ levels of analog gray voltages.

The first decoder 520 may select and output two different voltages of the 256 levels of analog gray voltages V0 to V255 as a first level voltage Vh and a second level voltage Vl in response to the upper 8-bit input image data D[9] to D[2] of the 10-bit input image data. Generally, the first level voltage Vh will be a higher voltage than the second level voltage Vl. In particular, the first decoder 520 may be a $2^8$-input and 2-output multiplexer that receives the upper 8-bits of image data D[9] to D[2] as the selection signals. The selection scheme performed by the multiplexer may be a matter of design choice based on the system employing the DAC 500.

The second decoder 530 distributes the first level voltage Vh and the second level voltage Vl repeatedly and outputs four distributed voltages V1, V2, V3 and V4 in response to the lower 2-bit input image data D[1] to D[0] of the 10-bit input image data. The four distributed voltages V1, V2, V3 and V4 may be generated four ways according to a logic combination of the lower 2-bit input image data D[1] to D[0] as illustrated in FIG. 6. When the lower 2-bit input image data D[1] to D[0] corresponds to '00', the second decoder 530 outputs 'Vh, Vh, Vh, and Vh' as the distributed voltages V1, V2, V3 and V4. When the lower 2-bit input image data D[1] to D[0] corresponds to '01', the second decoder 530 outputs 'Vh, Vh, Vh, and Vl' as the distributed voltages V1, V2, V3 and V4. When the lower 2-bit input image data D[1] to D[0] corresponds to '10', the second decoder 530 outputs 'Vh, Vh, Vl, and Vl' as the distributed voltages V1, V2, V3 and V4. When the lower 2-bit input image data D[1] to D[0] corresponds to '11', the second decoder 530 outputs 'Vh, Vl, Vl, and Vl' as the distributed voltages V1, V2, V3 and V4. That is, the second decoder 530 repeats the first level voltage Vh as the distributed voltages between 4 to 1 times, and correspondingly repeats the second level voltage Vl as the distributed voltages between 0 to 3 times. Namely, the second decoder 530 repeats the first level voltage P times and repeats the second level voltages Q-P times to generate the distributed voltages, where Q corresponds to a number of the distributed voltages, and P is an integer not less than one and not greater than Q.

The interpolated voltage generation unit 540 includes a first switching unit 541, a second switching unit 542, a third switching unit 543, a fourth switching unit 544, a capacitor unit 545, and/or an amplifier 546.

The first switching unit 541 includes a plurality of switches connected between output terminals of the decoder unit 550 and first terminals of the capacitor unit 545. The second switching unit 542 includes a switch connected between the second terminals of the capacitor unit 545 and an output terminal of the amplifier 546. The third switching unit 543 includes a plurality of switches connected between the first terminals of the capacitor unit 545 and the output terminal of the amplifier 546. The fourth switching unit 544 includes a switch connected between the output terminal of the amplifier 546 and an external circuit (not shown).

Hereinafter, the operation of the interpolated voltage generation unit 540 will be described in detail.

Figure 7:
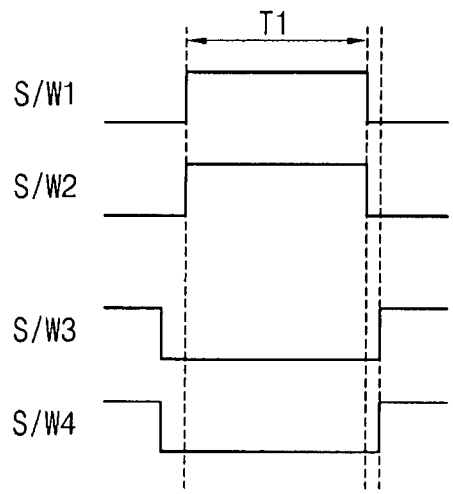
FIG. 7 is a timing diagram illustrating operation of switching units in FIG. 5.

FIG. 7 is a timing diagram illustrating operations of switching units and switches in FIG. 5.

All switches in FIG. 5 are initially disconnected (i.e., open). When the first switching unit 541 and the second switching unit 542 are simultaneously connected (i.e., closed), the distributed voltages V1, V2, V3 and V4 from the decoder unit 550 are respectively stored in capacitors C1, C2, C3 and C4 in the capacitor unit 545 in a charge configuration. As shown in FIG. 7, the first switching unit 541 is closed during a time interval T1 for sampling the distributed voltages V1, V2, V3 and V4. As further shown in FIG. 7, the first switching unit 541 and the second switching unit 542 are simultaneously opened and the third switching unit 543 and the fourth switching unit 544 are closed simultaneously after the time interval T1 has elapsed. By these successive switching operations, the capacitors C1, C2, C3 and C4 in the capacitor unit 545 are short-circuited with one another, and the charges stored in the capacitors C1, C2, C3 and C4 are averaged to be output at the output terminal of the amplifier 546. Accordingly, the interpolated voltage generation unit 540 may generate the averaged voltage to have a level corresponding to one of Vh, (3Vh+Vl)/4, (Vh+Vl)/2, and (Vh+3Vl)/4 with respect to the first level voltage Vh and the second level voltage Vl in response to the digital value of the lower 2 bits.

In an example embodiment, the interpolated voltage generation unit 540 may be complemented with an auto-zero sample-and-hold circuit.

Figure 8A:
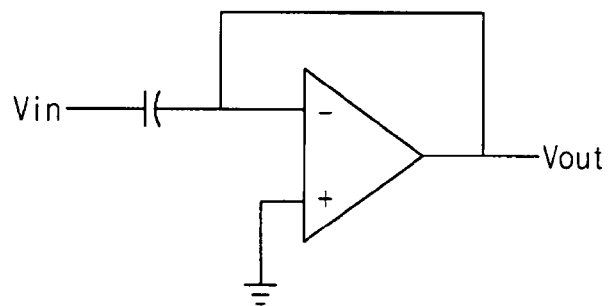
FIGS. 8A and 8B are diagrams illustrating an operation of the sample-and-hold circuit in FIG. 5.
Figure 8B:
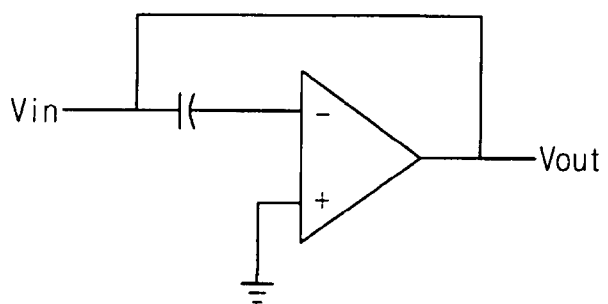

FIGS. 8A and 8B are diagrams illustrating an operation of the sample-and-hold circuit in FIG. 5.

In general, amplifier has a self-offset, thus the amplifier requires an offset controller for accurate output.

In FIGS. 8A and 8B, Vin represents an input voltage of an negative input terminal of the amplifier, Vout represents an output of the amplifier, and A represents the self-offset that may exist in the amplifier.

In FIG. 8A, the output Vout of the amplifier corresponds to Vin−Δ. In FIG. 8B, the output Vout of the amplifier corresponds to Vin−A−(−Δ). Then, the output Vout of the amplifier corresponds to Vin without separately controlling the offset. Therefore, the interpolated voltage generation unit 540 does not require an offset controller, thereby reducing the area of the overall circuit.

FIG. 9 is a circuit diagram illustrating another configuration of the DAC of FIG. 4 that processes 10-bit input image data by using a 9-bit standard circuit.

Referring to FIG. 9, a DAC 900 includes an analog gray voltage generation unit 910, a decoder unit 950 including a first decoder 920 and a second decoder 930, and/or an interpolated voltage generation unit 940.

Figures 10, 11:
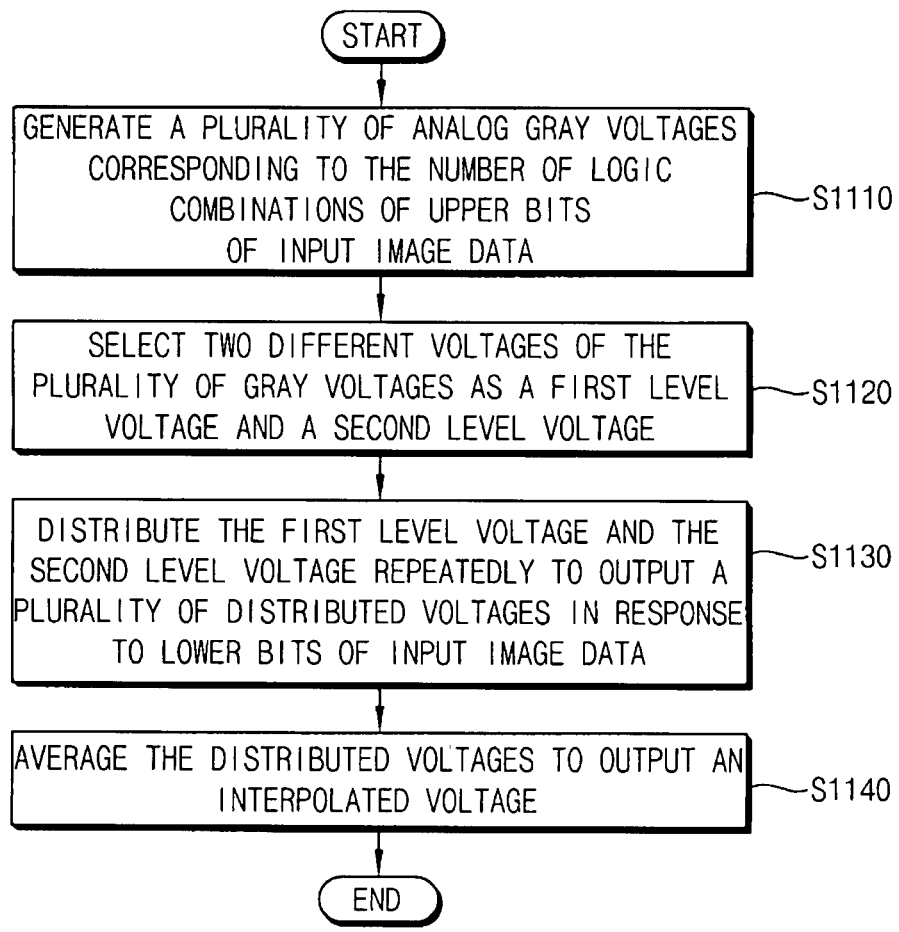
FIG. 10 is a table illustrating interpolated voltages in FIG. 9.
FIG. 11 is a flow chart illustrating a method of digital-to-analog (DA) conversion according to an example embodiment of the present invention.

The gray voltage generation unit 910 may generate $2^9$ levels of analog gray voltages. The first decoder 920 may select and output two different voltages of the 512 levels of analog gray voltages V0 to V511 as a first level voltage Vh and a second level voltage Vl in response to upper 9-bit input image data D[9] to D[1] of the 10-bit input image data. In particular, the first decoder 920 may be a $2^9$-input to 2-output multiplexer that receives the upper 9-bits of image data D[9] to D[1] as the selection signals. The selection scheme performed by the multiplexer may be a matter of design choice based on the system employing the DAC 900. The second decoder 930 may distribute the first level voltage Vh and the second level voltage Vl repeatedly and may output 2 distributed voltages V1 and V2 in response to the lower 1-bit input image data D[0] of the 10-bit input image data. As shown in FIG. 10, the 2 distributed voltages V1 and V2 may be generated 2 ways according to a digital value of the lower 1-bit input image data D[0]. When the lower 1-bit input image data D[0] corresponds to '0', the second decoder 930 outputs 'Vh and Vh' as the distributed voltages V1 and V2. When the lower 1-bit input image data D[0] corresponds to '1', the second decoder 930 outputs 'Vh and Vl' as the distributed voltages V1 and V2. That is, the second decoder 930 repeats the first level voltage Vh twice or once as the distributed voltages and correspondingly repeats the second level voltage Vl zero to one times as the distributed voltages. Namely, the second decoder 930 repeats the first level voltage P times and repeats the second level voltages Q-P times to generate the distributed voltages, where Q corresponds to a number of the distributed voltages, and P is an integer not less than one and not greater than Q.

The interpolated voltage generation unit 940 includes a first switching unit 941, a second switching unit 942, a third switching unit 943, a fourth switching unit 944, a capacitor unit 945, and/or an amplifier 946.

The first switching unit 941 includes a plurality of switches connected between output terminals of the decoder unit 950 and first terminals of the capacitor unit 945. The second switching unit 942 includes a switch connected between the second terminals of the capacitor unit 945 and an output terminal of the amplifier 946. The third switching unit 943 includes a plurality of switches connected between the first terminals of the capacitor unit 945 and the output terminal of the amplifier 946. The fourth switching unit 944 includes a switch connected between the output terminal of the amplifier 946 and an external circuit (not shown).

Hereinafter, the operation of the interpolated voltage generation unit 940 will be described in detail.

FIG. 7 is also a timing diagram illustrating operations of switching units in FIG. 9.

All switches in FIG. 9 are initially disconnected (i.e., open). When the first switching unit 941 and the second switching unit 942 are simultaneously connected (i.e., closed), the distributed voltages V1 and V2 from the decoder unit 950 are respectively stored in capacitors C1 and C2 in the capacitor unit 945 in a charge configuration. As shown in FIG. 7, the first switching unit 941 is closed during a time interval T1 for sampling the distributed voltages V1 and V2. As further shown in FIG. 7, the first switching unit 941 and the second switching unit 942 are simultaneously opened and the third switching unit 943 and the fourth switching unit 944 are closed simultaneously after the time interval T1 has elapsed. By these successive switching operations, the capacitors C1 and C2 in the capacitor unit 945 are short-circuited with each other, and the charges stored in the capacitors C1 and C2 are averaged to be output at the output terminal of the amplifier 546.

The interpolated voltage generation unit 940 may generate the averaged voltage to have a level corresponding to one of Vh and (Vh+Vl)/2 with respect to the first level voltage Vh and the second level voltage Vl in response to the digital value of the lower 1 bit as illustrated in FIG. 10.

In an example embodiment, the interpolated voltage generation unit 940 may be complemented with an auto-zero sample-and-hold circuit, and the interpolated voltage generation unit 940 does not require an offset controller, thereby reducing the area of the overall circuit as in FIG. 5.

FIG. 11 is a flow chart illustrating a method of digital-to-analog (DA) conversion according to an example embodiment of the present invention.

Referring to FIG. 11, the DA conversion method according to an example embodiment of the present invention includes generating a plurality of analog gray voltages corresponding to the number of logic combinations of upper K-bit input image data of N-bit image data (step S1110), selecting two different voltages of the plurality of the gray voltages as a first level voltage and a second level voltage in response to the upper K-bit input image data (step S1120), distributing the first level voltage and the second level voltage repeatedly to output a plurality of distributed outputs in response to the lower L-bit input image data (step S1130), and averaging the plurality of distributed voltages to output the averaged voltage (step S1140). Here, N corresponds to an integer less than two, K corresponds to an integer less than N, L is equal to N subtracted by K, and L is less than K.

FIG. 12 is a flow chart illustrating the step of averaging the distributed voltages in FIG. 11.

Referring to FIG. 12, averaging the plurality of distributed voltages to output the averaged voltage (step S1140 in FIG. 11) includes storing the distributed voltages in a capacitor unit in a configuration of charges (step S1141), averaging the distributed voltages by short-circuiting capacitors included in the capacitor unit (step S1143) and outputting the averaged voltages (step S1145).

As mentioned above, the DAC and/or the method of DA conversion according to example embodiments of the present invention may reduce the size of a decoder and/or may not require an extra circuit for controlling the self-offset of the amplifier; and thus, the DAC and/or the method of DA conversion may generate accurate interpolated voltages while reducing the circuit size.

Having thus described example embodiments, it is to be understood that the embodiments are not to be limited by particular details set forth in the above description as many apparent variations thereof are possible without departing from the spirit or scope thereof.

What is claimed is:
1. A digital-to-analog converter (DAC) comprising:
an analog gray voltage generation unit configured to generate a plurality of analog gray voltages;
a first decoder configured to select two different voltages of the plurality of the gray voltages as a first level voltage and a second level voltage, respectively, in response to an upper K-bits of N-bit input image data, N being an integer not less than two, K being an integer less than N;
a second decoder configured to repeatedly distribute the first level voltage and the second level voltage to output a plurality of distributed voltages in response to a lower L-bits of the N-bit input image data, L being equal to N subtracted by K, L being less than K; and
an interpolated voltage generation unit configured to generate an interpolated voltage based on the plurality of distributed voltages and as an average of the plurality of distributed voltages, wherein the interpolated voltage generation unit includes:
an amplifier;
a capacitor unit connected to an input terminal of the amplifier;
a first switching unit configured to selectively supply the plurality of distributed voltages to the capacitor unit;
a second switching unit configured to selectively connect an output terminal of the amplifier with the input terminal of the amplifier; and
a third switching unit configured to selectively connect the terminals of the capacitor unit and the output terminal of the amplifier.

2. The DAC of claim 1, wherein the plurality of analog voltages corresponds in number to a number of logic combinations of the upper K-bits of the N-bit input image data.

3. The DAC of claim 1, wherein the second decoder repeats the first level voltage P times and repeats the second level voltages Q-P times to generate the distributed voltages, where Q corresponds to a number of the distributed voltages, and P is an integer not less than one and not greater than Q.

4. The DAC of claim 1, wherein the second decoder is configured to set a value of P based on the lower L-bits of the N-bit input image data.

5. The DAC of claim 4, wherein for L=2, there are four possible sets of the plurality of distributed voltages, each set corresponding to one of P=4, 3, 2, and 1.

6. The DAC of claim 4, wherein for L=2, the second decoder is configured to output one of the following sets of four voltages as the plurality of distributed voltages: (Vh, Vh, Vh, Vh), (Vh, Vh, Vh, Vl), (Vh, Vh, Vl, Vl), (Vh, Vl, Vl, Vl) in response to the lower 2-bits of the N-bit input image data, where Vh represents the first level voltage and Vl represents the second level voltage.

7. The DAC of claim 6, wherein the interpolated voltage generation unit is configured to generate the interpolated voltage to have a level corresponding to one of Vh, (3Vh+Vl)/4, (Vh+Vl)/2, and (Vh+3Vl)/4.

8. The DAC of claim 4, wherein for L=1, there are two possible sets of the plurality of distributed voltages, each set corresponding to one of P=2 and 1.

9. The DAC of claim 4, wherein for L=1, the second decoder is configured to output one of the following sets of two voltages as the plurality of distributed voltages: (Vh, Vh), (Vh, Vl) in response to the lower 1-bit of N-bit input image data, where Vh represents the first level voltage and Vl represents the second level voltage.

10. The DAC of claim 9, wherein the interpolated voltage generation unit is configured to generate the interpolated voltage to have a level corresponding to one of Vh, and (Vh+Vl)/2.

11. The DAC of claim 1, wherein the interpolated voltage generation unit is implemented with an auto-zero sample-and-hold circuit.

12. The DAC of claim 1, wherein the interpolated voltage generation unit further comprises:
a fourth switching unit configured to selectively connect the output terminal of the amplifier with an external device.

13. The DAC of claim 1, wherein the interpolated voltage generation unit charges the capacitor unit with the plurality of distributed voltages to sample the plurality of distributed voltages by simultaneously turning on the first switching unit and the second switching unit, and averages the plurality of distributed voltages by simultaneously turning off the first switching unit and the second switching unit and turning on the third switching unit.

14. The DAC of claim 1, wherein the second switching unit and the third switching unit set a self-offset of the amplifier to substantially zero through their switching operations.

15. A method of digital-to-analog (DA) conversion comprising:
generating a plurality of analog gray voltages;
selecting two different voltages of the plurality of the gray voltages as a first level voltage and a second level voltage in response to an upper K-bits of N-bit input image data, N being an integer not less than two, K being an integer less than N;
distributing the first level voltage and the second level voltage repeatedly to generate a plurality of distributed voltages in response to a lower L-bits of the N-bit input image data, L being equal to N subtracted by K, and L being less than K; and
averaging the plurality of distributed voltages to output an interpolated voltage, wherein averaging includes
storing the plurality of distributed voltages in a capacitor unit as a configuration of charges,
averaging the plurality of distributed voltages by short-circuiting capacitors included in the capacitor unit,
outputting the average as the interpolated voltage, and
for L=2, the distributing step is configured to output one of the following sets of four voltages as the plurality of distributed voltages: (Vh, Vh, Vh, Vh), (Vh, Vh, Vh, Vl), (Vh, Vh, Vl, Vl), (Vh, Vl, Vl, Vl) in response to the lower 2-bits of the N-bit input image data, where Vh represents the first level voltage and Vl represents the second level voltage.

16. The method of claim 15, wherein the interpolated voltage has a voltage level corresponding to one of Vh, (3Vh+Vl)/4, (Vh+Vl)/2, and (Vh+3Vl)/4.

17. A method of digital-to-analog (DA) conversion comprising:
generating a plurality of analog gray voltages;
selecting two different voltages of the plurality of the gray voltages as a first level voltage and a second level voltage in response to an upper K-bits of N-bit input image data, N being an integer not less than two, K being an integer less than N;
distributing the first level voltage and the second level voltage repeatedly to generate a plurality of distributed voltages in response to a lower L-bits of the N-bit input image data, L being equal to N subtracted by K, and L being less than K; and
averaging the plurality of distributed voltages to output an interpolated voltage, wherein averaging includes
storing the plurality of distributed voltages in a capacitor unit as a configuration of charges,
averaging the plurality of distributed voltages by short-circuiting capacitors included in the capacitor unit,
outputting the average as the interpolated voltage, and
for L=1, the distributing step is configured to output one of the following sets of two voltages as the plurality of distributed voltages: (Vh, Vh), (Vh, Vl) in response to the lower 1-bit of the N-bit input image data, where Vh represents the first level voltage and Vl represents the second level voltage.

18. The method of claim 17, wherein the interpolated voltage has a voltage level corresponding to one of Vh, and (Vh+Vl)/2.

* * * * *